US008932667B2

(12) United States Patent
Qiu et al.

(10) Patent No.: US 8,932,667 B2
(45) Date of Patent: *Jan. 13, 2015

(54) HARD MAGNET WITH CAP AND SEED LAYERS AND DATA STORAGE DEVICE READ/WRITE HEAD INCORPORATING THE SAME

(75) Inventors: Jiaoming Qiu, St. Paul, MN (US); Younghua Chen, Eden Prairie, MN (US); Xilin Peng, Bloomington, MN (US); Shaun McKinlay, Eden Prairie, MN (US); Eric W. Singleton, Maple Plain, MN (US); Brian W. Karr, Savage, MN (US)

(73) Assignee: Seagate Technology LLC, Cupertino, CA (US)

( * ) Notice: Subject to any disclaimer, the term of this patent is extended or adjusted under 35 U.S.C. 154(b) by 1271 days.

This patent is subject to a terminal disclaimer.

(21) Appl. No.: 12/112,671

(22) Filed: Apr. 30, 2008

(65) Prior Publication Data
US 2009/0274931 A1    Nov. 5, 2009

(51) Int. Cl.
*H01F 41/22* (2006.01)
*G01R 33/09* (2006.01)
(Continued)

(52) U.S. Cl.
CPC .............. *H01F 41/22* (2013.01); *G01R 33/098* (2013.01); *G11B 5/3163* (2013.01); *G11B 5/3906* (2013.01); *G11B 5/3932* (2013.01); *H01F 10/14* (2013.01); *H01F 10/16* (2013.01)
USPC ........... 427/127; 427/128; 427/130; 427/131; 427/132

(58) Field of Classification Search
USPC ................................................. 427/127–131
See application file for complete search history.

(56) References Cited

U.S. PATENT DOCUMENTS 5,363,794 A * 11/1994 Lairson et al. ..................... 117/7
5,729,410 A    3/1998 Fontana, Jr. et al.
(Continued)

OTHER PUBLICATIONS

Kuo et al "Microstructure and magnetic properties of FePt alloy films" Feb. 15, 1999 Journal of App. Phys. vol. 85 No. 4.*
(Continued)

*Primary Examiner* — Mandy Louie
(74) *Attorney, Agent, or Firm* — Westman, Champlin & Koehler, P.A.

(57) ABSTRACT

A method including forming a multilayer structure. The multilayer structure includes a seed layer comprising a first component selected from the group consisting of a Pt-group metal, Fe, Mn, Ir and Co. The multilayer structure also includes an intermediate layer comprising the first component and a second component selected from the group consisting of a Pt-group metal, Fe, Mn, Ir and Co. The second component is different than the first component. The multilayer structure further includes a cap layer comprising the first component. The method further includes heating the multilayer structure to an annealing temperature to cause a phase transformation of the intermediate layer. Also a hard magnet including a seed layer comprising a first component selected from the group consisting of a Pt-group metal, Fe, Mn, Ir and Co. The hard magnet also includes a cap layer comprising the first component. The hard magnet further includes an intermediate layer between the seed layer and the cap layer. The intermediate layer includes the first component and a second component selected from the group consisting of a Pt-group metal, Fe, Mn, Ir and Co. The first component is different than the second component. Additionally, a read/write head including the hard magnet.

12 Claims, 13 Drawing Sheets

(51) Int. Cl.
  G11B 5/31 (2006.01)
  G11B 5/39 (2006.01)
  H01F 10/14 (2006.01)
  H01F 10/16 (2006.01)

(56) References Cited

U.S. PATENT DOCUMENTS

| | | | | |
|---|---|---|---|---|
| 5,824,409 | A * | 10/1998 | Sellmyer et al. | 428/332 |
| 6,605,321 | B1 * | 8/2003 | Ravelosona-Ramasitera et al. | 427/528 |
| 6,666,930 | B2 * | 12/2003 | Aoyama et al. | 148/306 |
| 6,756,239 | B1 * | 6/2004 | Nickel et al. | 438/3 |
| 2002/0101689 | A1 * | 8/2002 | Tang et al. | 360/314 |
| 2006/0012905 | A1 * | 1/2006 | Okino et al. | 360/48 |
| 2006/0193089 | A1 * | 8/2006 | Li et al. | 360/324.11 |

OTHER PUBLICATIONS

Yan et al. "Highly oriented nonepitaxially grown L10 FePt film" May 15, 2003, Journal of App. Phys. vol. 93 No. 10 p. 8292-8294.*

Seki "Magnetic properties and microstructure of the granular films processed by annealing FePt based multilayerse" Transaction on Magn. vol. 41 No. 10 Oct. 2005 p. 3799-3801.*

Lin "Peak Identification of Conventional X-ray Diffraction Patterns for MBE FePt Thin films on MgO Single crystal Substrates" JCPDS—Inter Cent. Diff Data 1999 p. 46-52.*

Yousong "Structural and magnetic properties of RF sputtered FePt/Fe multilayers" Jou of Magn and Magn Mat. 297 (2006) 7-16.*

Wei "Effects of Pt and Fe underlayers on the microstructure and magnetization reversal of epitaxial FePt films for high area density magnetic recording" Mar. 7, 2008.*

Yao Iron platinum multilayer thin film reactions to form L1(0) iron platinum and exchange spring magnetic OAI Jan. 2008 (excerpt-images).*

Chen et al., "Largely Enhanced Coercivity of FePt Film at Low Temperature by Introduction of CrRu Underlayer," Journal of Magnetism and Magnetic Materials, 310, e921-e923, 2007.

Dodrill, "Magnetic Media Measurements with a VSM," Lake Shore Cryotronics, Inc., www.lakeshore.com, 10 pages, printed on Jun. 5, 2006.

* cited by examiner

US 8,932,667 B2

HARD MAGNET WITH CAP AND SEED LAYERS AND DATA STORAGE DEVICE READ/WRITE HEAD INCORPORATING THE SAME

BACKGROUND

Magnetic data storage devices include magnetic read/write heads, which detect and modify the magnetic properties of a magnetic storage medium. For example, the read/write head includes a magnetoresistive sensor that changes resistance in response to an applied magnetic field. Based on this change in resistance, the read/write head senses or modifies the magnetic properties of the magnetic storage medium.

SUMMARY

In one aspect, the present disclosure is directed to a hard magnet including a seed layer comprising a first component selected from the group consisting of a Pt-group metal, Fe, Mn, Ir and Co. The hard magnet also includes a cap layer comprising the first component. The hard magnet further includes an intermediate layer between the seed layer and the cap layer. The intermediate layer includes the first component and a second component selected from the group consisting of a Pt-group metal, Fe, Mn, Ir and Co. The first component is different than the second component.

The details of one or more embodiments of the invention are set forth in the accompanying drawings and the description below. These and various other features and advantages will be apparent from a reading of the following detailed description.

DETAILED DESCRIPTION

The present disclosure is generally directed to magnetic materials for use in data storage applications. In some embodiments, the magnetic materials may be used in a read/write head for a magnetic data storage device. The magnetic materials may be formed from an alloy including platinum (Pt) and iron (Fe), for example, and may be formed by a low-temperature annealing of the alloy, a seed layer and a cap layer. The magnetic materials preferably include a $L1_0$ phase constitution, and have a desirably high coercivity and a large saturation magnetization.

While the present disclosure discusses the use of the magnetic materials as biasing magnets in a read/write head for a disc drive, the magnetic materials may also be useful in other applications where a magnetic material with high coercivity and relatively small magnetic grain sizes are desired. For example, the magnetic materials described herein may be useful for magnetic media.

Figure 1:
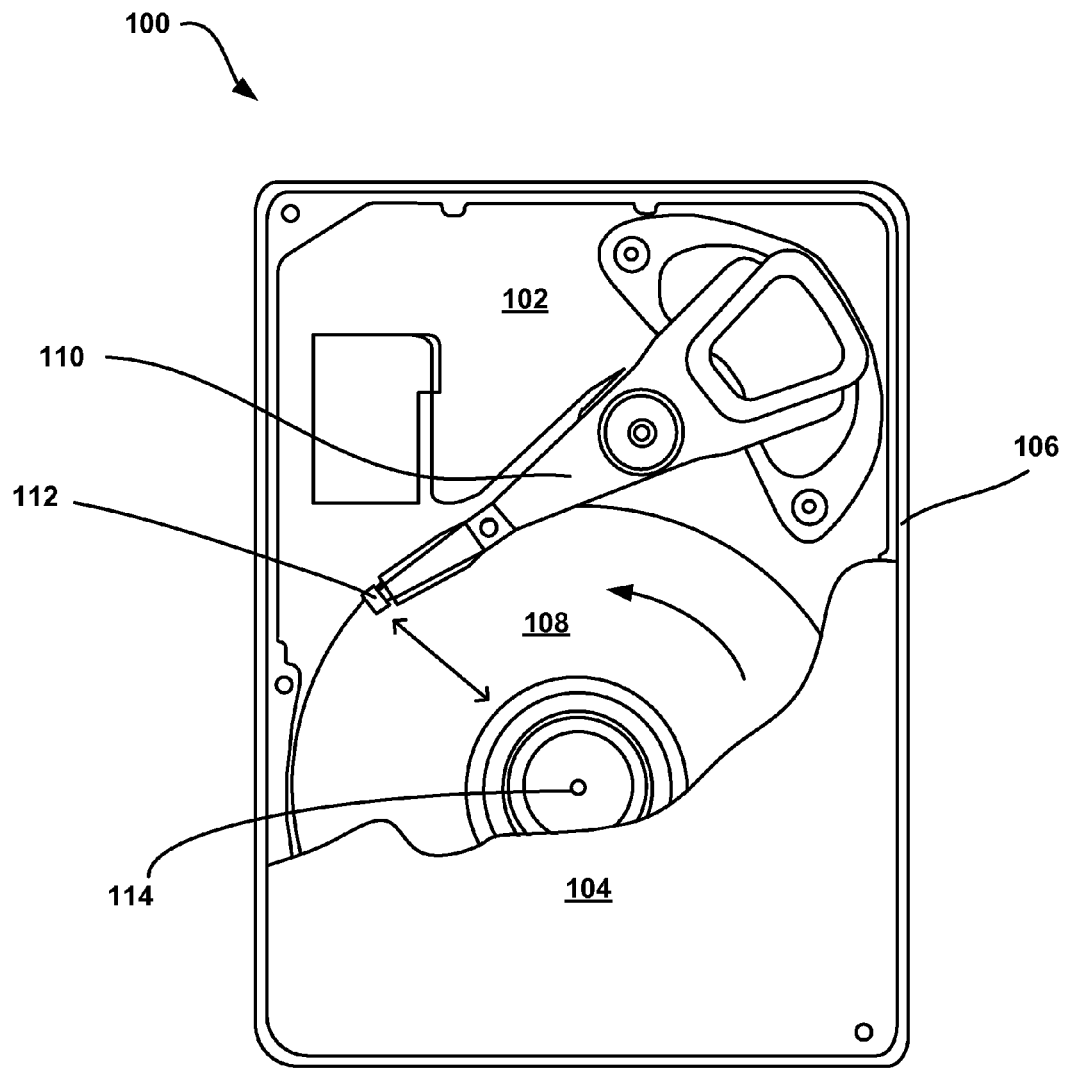
FIG. 1 is a schematic diagram of a hard disc drive.

FIG. 1 illustrates an exemplary magnetic disc drive 100 including a read/write head according to one aspect of the present disclosure. Disc drive 100 includes base 102 and top cover 104, shown partially cut away. Base 102 combines with top cover 104 to form the housing 106 of disc drive 100. Disc drive 100 also includes one or more rotatable magnetic data discs 108. Data discs 108 are attached to spindle 114, which operates to rotate discs 108 about a central axis. Magnetic recording and read head 112 is adjacent to data discs 108. Actuator arm 110 carries magnetic recording and read head 112 for communication with each of the data discs 108.

The data discs 108 store information as magnetically oriented bits on a magnetic film. Magnetic read/write head 112 includes a recording (write) head that generates magnetic fields sufficient to magnetize discrete domains of the magnetic film on data discs 108. These discrete domains of the magnetic film each represent a bit of data, with one magnetic orientation representing a "0" and a substantially opposite magnetic orientation representing a "1." Magnetic recording and read head 112 also includes a read head that is capable of detecting the magnetic fields of the discrete magnetic domains of the magnetic film.

Figure 2:
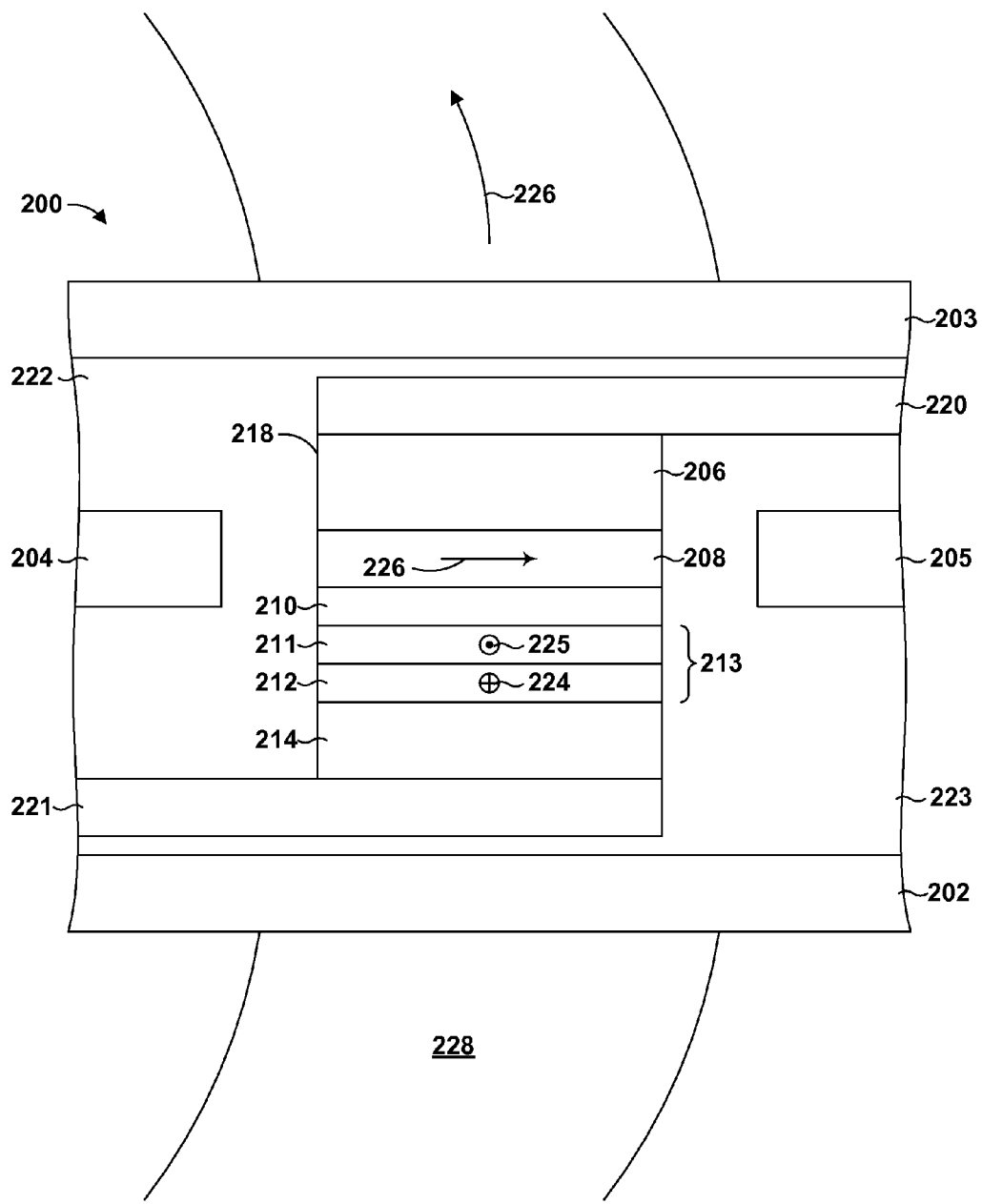
FIG. 2 is a block diagram illustrating a hard disc read head including a tunneling magneto-resistance sensor.

FIG. 2 is a schematic block diagram illustrating an embodiment of a hard disc read head 200 that may be used with magnetic read/write head 112 in FIG. 1. The read head 200 utilizes magneto-resistance to read data from data discs, such as the data discs 108 of FIG. 1. While the precise nature of the read head 200 may vary widely, a tunneling magneto-resistance read head will be described as one example of a read head 200 in which the disclosed magnetic materials may be utilized. It will be understood, though, that the magnetic materials described herein may be used in any useful read head 200, such as, for example, a current perpendicular-to-the-plane giant magneto-resistive head, a giant magneto-resistive head, or the like. Furthermore, the magnetic materials may find use in many other applications where a high coercivity and/or a large saturation magnetization are desired.

Referring again to FIGS. 1-2, the read head 200 flies over the surface of data discs 108 on an air bearing created by the rotation of data discs 108. The data discs 108 have a plurality of data tracks 228, one of which is shown in FIG. 2. The tracks 228 are divided into a plurality of bits. As the disc 108 rotates, as indicated by arrow 226, the read head 200 follows a data track 228 and may read each bit as it passes under sensor 218.

The read head 200 includes a first shield layer 202 and a second shield layer 203, a tunneling magneto-resistive sensor 218 and two hard magnets 204, 205. The first and second shield layers 202, 203 reduce or substantially block extraneous magnetic fields, such as, for example, those from adjacent bits on data discs 108 from impacting the sensor 218, thus improving the performance of the sensor 218. Ideally, the first and second shield layers 202, 203 permit magnetic fields from only the bit directly under sensor 218 to affect the sensor, and thus be read. Thus, as the physical size of bits continues to decrease, the shield-to-shield spacing also decreases.

The sensor 218 includes a plurality of layers, including an antiferromagnetic seed layer 214, a pinned layer 212, a reference layer 211, a tunneling barrier layer 210, a free layer 208 and a cap layer 206. The antiferromagnetic layer 214 is electrically coupled to a first electrode 221, and the cap layer 206 is electrically coupled to a second electrode 220. The pinned layer 212 is formed on and exchange coupled to the antiferromagnetic layer 214. The exchange coupling fixes the magnetic moment of the pinned layer 212 in a known orientation. Likewise, the magnetic moment of the pinned layer 212 induces a substantially antiparallel magnetic field in the reference layer 211. Together, the pinned layer 212 and the reference layer 211 form a synthetic antiferromagnet 213. The magnetic moments of each of the pinned layer 212 and the reference layer 211 are not allowed to rotate under magnetic fields in the range of interest (e.g., magnetic fields generated by the bits of data stored on the data discs 108). The magnetic moments of the reference layer 211 and the pinned layer 212 are generally oriented normal to the plane of FIG. 2 and antiparallel to each other, as indicated by arrow tail 224 and arrow head 225 (e.g., into and out of the plane of FIG. 2).

The sensor also includes a free layer 208, which is not exchange coupled to an antiferromagnet. Thus, the magnetic moment of the free layer 208 is free to rotate under the influence of an applied magnetic field in the range of interest.

The read head 200 further includes a pair of bias magnets 204 and 205, which produce a magnetic field that biases the free layer 208 with a magnetic moment parallel to the plane of the figure and generally oriented horizontally, as indicated by arrow 226. This bias prevents the magnetic moment of the free layer 208 from drifting due to, for example, thermal energy, which may introduce noise into the data sensed by the read head 200. The bias is sufficiently small, however, that the magnetic moment of the free layer 208 can change in response to an applied magnetic field, such as a magnetic field of a data bit stored on data discs 108. The sensor 218 and electrodes 220, 221 are separated and electrically isolated from the bias magnets 204, 205 by insulating materials 222, 223, respectively.

The tunneling barrier layer 210 separates the free layer 208 and the reference layer 211. The tunneling barrier layer 210 is sufficiently thin that quantum mechanical electron tunneling occurs between the reference layer 211 and the free layer 208. The electron tunneling is electron-spin dependent, making the magnetic response of the sensor 218 a function of the relative orientations and spin polarizations of the reference layer 211 and the free layer 208. The highest probability of electron tunneling occurs when the magnetic moments of the reference layer 211 and the free layer 208 are parallel, and the lowest probability of electron tunneling occurs when the magnetic moments of the reference layer 211 and the free layer 208 are antiparallel. Accordingly, the electrical resistance of the sensor 218 changes in response to an applied magnetic field. The data bits on discs 108 are magnetized in a direction normal to the plane of FIG. 2, either into the plane of the figure, or out of the plane of the figure. Thus, when the sensor 218 passes over a data bit, the magnetic moment of the free layer 208 is rotated either into the plane of FIG. 2 or out of the plane of FIG. 2, changing the electrical resistance of the sensor 218. The value of the bit being sensed by the sensor 218 (e.g., either 1 or 0) may therefore be determined based on the current flowing from the first electrode 221 to the second electrode 220.

Figure 3:
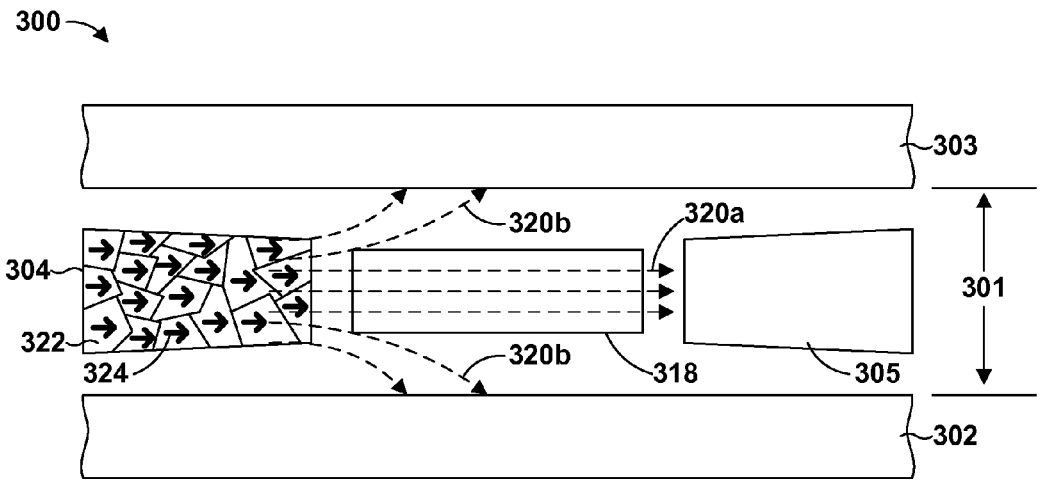
FIG. 3 is a block diagram illustrating a hard disc read head.
Figure 4:
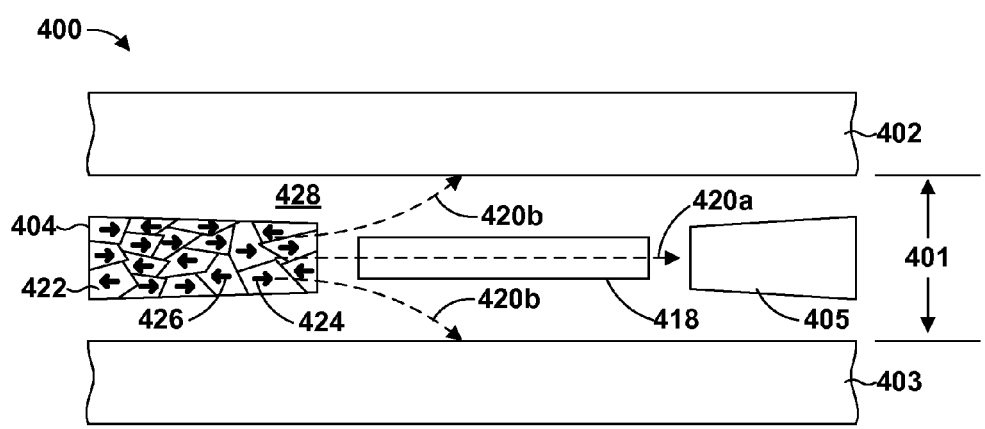
FIG. 4 is a block diagram illustrating another hard disc read head.

To increase the storage capacity of a magnetic data storage device such as a disc drive, the size of the magnetically oriented domains (bits) on the data discs 108 is continually being made smaller to produce higher data densities. Accordingly, the size of read head 200 must be made smaller, and particularly, the shield to shield spacing must be decreased, so that the sensor 218 is substantially isolated from the magnetic fields of adjacent bits on data discs 108. FIGS. 3 and 4 illustrate example complications that occur when the shield to shield spacing is decreased.

FIG. 3 shows an embodiment of a read head 300 including a first shield 302 and a second shield 303 separated by a distance 301. The read head 300 includes a sensor 318, a first biasing magnet 304 and a second biasing magnet 305, similar to read head 200. The layers of sensor 318 are not shown in FIG. 3 for the sake of clarity. First biasing magnet 304 includes a plurality of magnetized domains 322, each with a magnetization direction represented by arrows 324. The first biasing magnet 304 produces a magnetic field represented by flux lines 320a and 320b (collectively, "flux lines 320"). As is shown, some of the flux lines 320b are not emitted in the plane of magnets 304, 305 and sensor 318, but instead impact one of shield 302 or shield 303. These flux lines represent an amount of the magnetic field produced by first biasing magnet 304 that does not contribute to the biasing of the free layer of sensor 318. Flux lines 320a, however, travel through sensor 318. At least some of this portion of the magnetic field contributes to the biasing of the free layer of sensor 318 in the horizontal direction (i.e., parallel to flux lines 320a).

FIG. 4, then, shows a read head 400 that includes a smaller shield-to-shield spacing 401, which may be used to read smaller magnetized domains on data discs 108. In the embodiment shown in FIG. 4, the size of the biasing magnets 404, 405 are shown as being smaller compared to those in FIG. 3, as is sensor 418. However, this may not be true in all embodiments. For example, in some embodiments, only the thickness of the insulating material 428 may be made smaller, while the biasing magnets 404, 405 and the sensor 418 remain the same size.

Regardless whether the sizes of the biasing magnets 404, 405 and sensor 418 are smaller, the reduction in shield to shield spacing 401 results in a larger portion of the magnetic field generated by biasing magnet 404 encountering one of first shield 402 or second shield 403, as is represented by flux lines 420b. The increased portion of the magnetic field encountering one of shields 402, 403 results in a smaller portion of the field being available for biasing the free layer (not shown in FIG. 4), represented by single flux line 420a. Because of this lower bias, the signal-to-noise ratio of the sensor 418 may be lower, which is disadvantageous.

FIGS. 3-4 illustrate another complication that may occur with a smaller read head 400. For example, biasing magnet 404 includes smaller magnetic grains 422 relative to the magnetic grains 322 of biasing magnet 304. The smaller magnetic grains 422 result in a higher probability that the thermal energy present in the system will cause the magnetic moment of an individual grain 422 to reorient itself, as indicated by arrow 426. The reorientation of the magnetic moments of the individual magnetic grains 422 may decrease the overall magnetic moment of the biasing magnet 404, and over time may in fact decrease the magnetic moment significantly.

Accordingly, bias magnets 404, 405 with a higher saturation magnetization and coercivity are desired. The higher magnetization may increase the magnetic flux of the bias magnets 404, 405 that is useful for biasing the free layer, and the higher coercivity may increase the stability of the magnetization. This may in turn facilitate the use of smaller sensors (e.g., sensor 418) in the read head 400 of a hard disc drive (e.g., disc drive 100).

Alloys including iron and a platinum group metal may provide a relatively high coercivity and magnetic moment. The Pt-group metal may be selected from, for example, Pt, Pd, Ir, Rh and Ru, or combinations thereof. Pt-group metals including Pt are preferred, and Pt is particularly preferred.

The alloys may also include other elements in a minority amount, such as, for example, copper, gold, silver and the like. However, to provide high coercivity and high magnetic moment, the iron-platinum alloy should preferably include a high-anisotropy $L1_0$, or face centered tetragonal (FCT), phase constitution.

Figure 5:
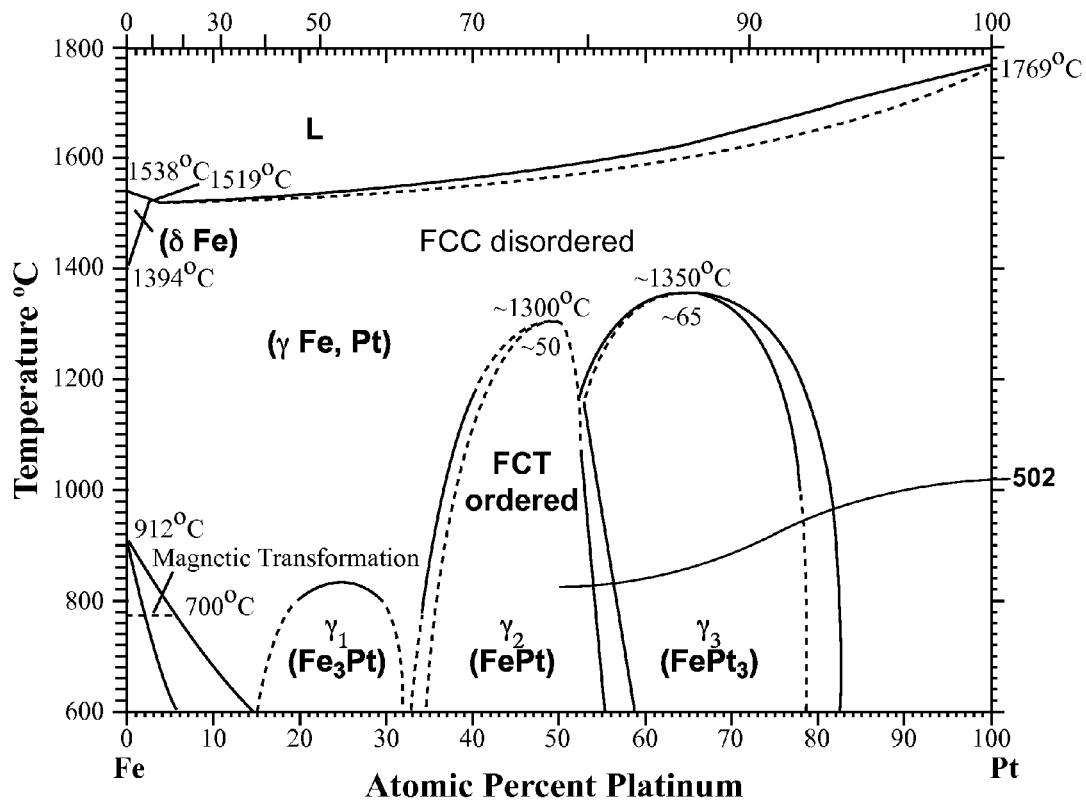
FIG. 5 is a phase diagram for a platinum-iron binary system.
Figure 6:
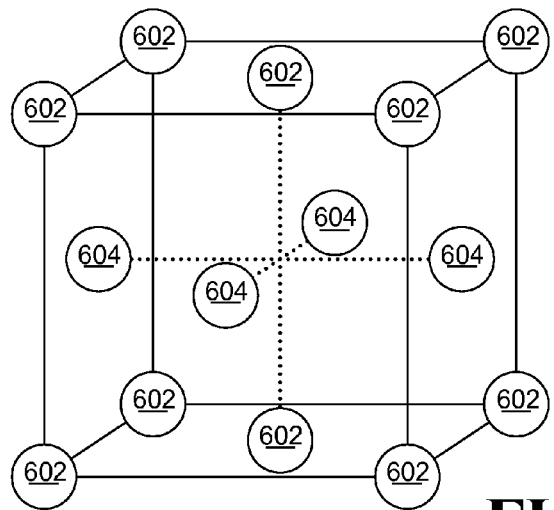
FIG. 6 is a crystal unit cell of a $L1_0$ phase constitution platinum-iron binary alloy.

For example, as shown in the iron-platinum (FePt) binary phase diagram of FIG. 5, the $L1_0$ phase constitution can be a solid solution including between about 35 atomic percent (at. %) and about 57 at. % platinum (Pt), with the remainder Fe and incidental impurities (e.g., less than about 1 at. % impurities). More preferably, FIG. 6 shows an $L1_0$ phase constitution in which the Pt atoms 602 and Fe atoms 604 are ordered in alternating sheets in an 1:1 atomic ratio (for an alloy that is approximately 50 at. % Pt and approximately 50 at. % Fe, not including incidental impurities).

The $L1_0$ phase typically requires a relatively high temperature (greater than about 500° C.) annealing of a FCC disordered alloy (also referred to as an A1 phase alloy) to produce the ordered structure of Pt and iron (Fe) atoms in the $L1_0$ phase constitution. This high temperature annealing step has prevented the use of FePt alloys in hard disc read heads, such as read head 200, because the remaining components of the read head 200 (e.g., the sensor 218) degrade at such temperatures.

In one aspect, the present disclosure is directed to a method of forming alloys having an ordered phase constitution without requiring a high temperature annealing step. The method generally includes the use of a multilayer structure including a seed layer and a cap layer. The multilayer structure further includes at least one intermediate layer that includes the alloy. In some embodiments, the seed and/or cap layers include a component of the alloy, and in some preferred embodiments, the seed and/or cap layer component is a minority component of the alloy.

Figure 7:
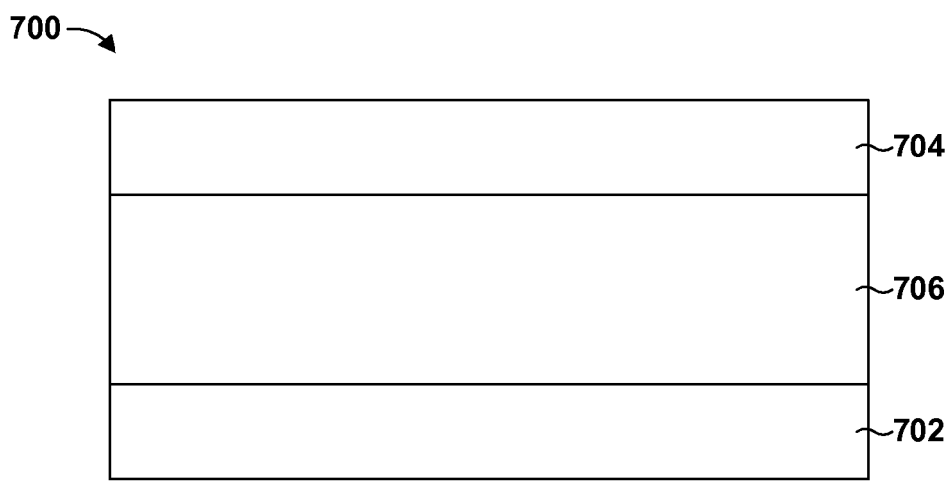
FIG. 7 is a block diagram of a multilayer structure including a seed layer, a cap layer and an intermediate alloy layer.

FIG. 7 illustrates a multilayer structure 700 which may be used to produce an ordered phase constitution alloy with high anisotropy. Multilayer structure 700 includes a seed layer 702, a cap layer 704 and an intermediate alloy layer 706 formed between the seed layer 702 and cap layer 704. The alloy layer 706, seed layer 702 and cap layer 704 may be made from a wide range of components including, for example, Pt, Fe, Mn, Ir, Co, or the like for producing a ferromagnetic alloy, a ferrimagnetic alloy, or an antiferromagnetic alloy. In some embodiments, the seed layer 702 and the cap layer 704 include a component that is present in the alloy layer 706. In other embodiments, the seed layer 702 and the cap layer 704 include a component that is not present in the alloy layer 706.

In some embodiments, at least one of the seed layer 702 and the cap layer 704 include more than one component that is present in the alloy layer 706. For example, the seed layer 702, the cap layer 704 and the alloy layer 706 may each include a first component and a second component. In some embodiments, at least one of the seed layer 702 and the cap layer 704 include a majority amount of the component that is present in alloy layer 706 in a minority amount. For example, at least one of seed layer 702 and cap layer 704 may include a majority of Pt and a minority of Fe, which alloy layer 706 includes a majority of Fe and a minority of Pt. In some embodiments, both the seed layer 702 and the cap layer 704 include a majority of the component that is present in the alloy layer 706 in a minority amount.

The seed layer 702, alloy layer 706 and cap layer 704 may be deposited using a number of techniques, including, for example, sputtering, ion beam deposition, chemical vapor deposition, physical vapor deposition, molecular beam epitaxy, laser ablation, and the like. In one embodiment, the seed layer 702 is deposited on a substrate using one of these techniques, the alloy layer 706 is deposited on the seed layer 702 using the same or a different technique and the cap layer 704 is deposited on the alloy layer 706 using any of the techniques.

Utilizing a seed layer and a cap layer may be advantageous compared to annealing a single film of the alloy, annealing an alloy with only a seed layer 702 or annealing an alloy with only a cap layer 704. FIGS. 8A-D illustrate one such advantage. One important parameter shown in these plots is the coercivity of the alloy. The coercivity is the magnetic field at which the magnetic moment is equal to zero, or the point at which the magnetic moment-magnetic field curve crosses the magnetic field axis (the x-axis). The in-plane coercivity indicates the extent to which the atoms are ordered into an ordered phase constitution and the extent of magnetic anisotropy in the alloy. That is, a higher in-plane coercivity indicates a more highly ordered alloy with greater magnetic anisotropy.

Figure 8A:
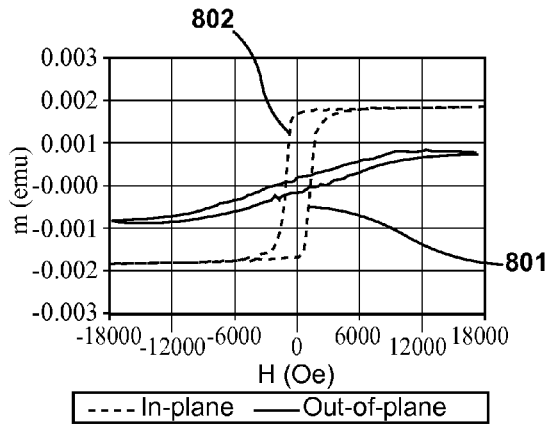
FIGS. 8A-D are plots of magnetic moment versus magnetic field for an iron-platinum magnetic material formed as a single film layer, formed with a platinum seed layer, formed with a platinum cap layer, and formed with both a platinum seed layer and a platinum cap layer, respectively.
Figure 8B:
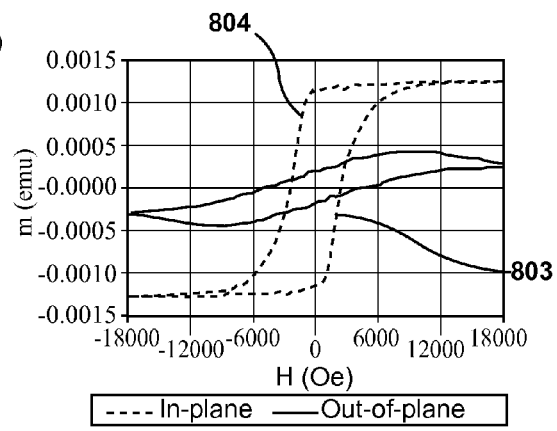

For example, FIG. 8A shows the magnetic moment of a FePt alloy in response to an applied magnetic field. The FePt alloy of FIG. 8A included, prior to annealing, about 38 at. % Pt and about 62 at. % Fe and was annealed at a temperature of about 300° C. for about 4 hours. As can be seen, the in-plane coercivity, calculated by averaging the absolute values of the coercivities of curves 801 and 802, is approximately 1420 Oe. FIG. 8B, then, shows a FePt alloy of the same composition as the alloy of FIG. 8A that was formed with a Pt seed layer 702. The sample in FIG. 8B was annealed at a temperature of about 300° C. for about 4 hours, similar to the sample in FIG. 8A. The sample of FIG. 8B shows an in-plane coercivity, calculated by averaging the absolute values of the coercivities of curves 803 and 804, of approximately 2400 Oe.

Figure 8C:
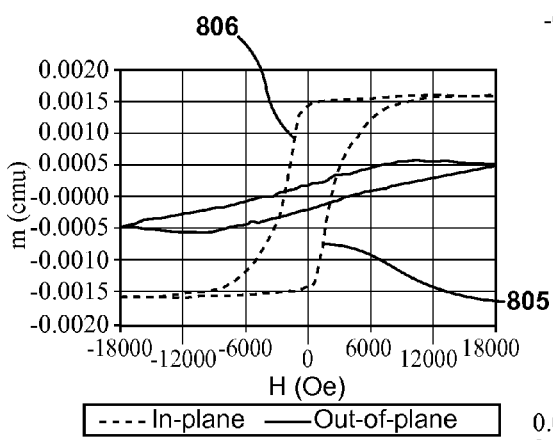

FIG. 8C shows the results from a FePt alloy sample again including, prior to annealing, about 38 at. % Pt and about 62 at. % Fe. The sample was annealed at a temperature of about 300° C. for about 4 hours with a cap layer 704 of Pt. The sample shows an in-plane coercivity, calculated by averaging the absolute values of the coercivities of curves 805 and 806, of about 2200 Oe, similar to the alloy of FIG. 8B.

Figure 8D:
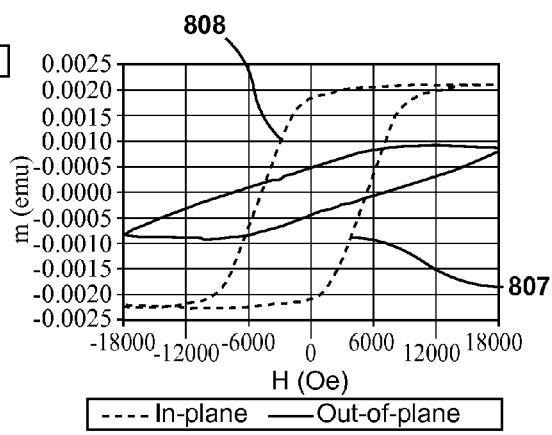

FIG. 8D, then, shows the results from a FePt alloy sample including, prior to annealing, about 38 at. % Pt and 62 at. % Fe that was formed with a Pt seed layer 702 and a Pt cap layer 704 and annealed at a temperature of about 300° C. for about 4 hours. The sample shows an in-plane coercivity, calculated by averaging the absolute values of the coercivities of curves 807 and 808, of about 5100 Oe, which is significantly higher than any of the samples shown in FIGS. 8A-C. While not wishing to be bound by any theory, presently available data indicates that this effect is due to interdiffusion occurring at both the seed layer 702/alloy layer 706 and cap layer 704/alloy layer 706 interfaces, which facilitates the ordering of the Fe and Pt atoms into an $L1_0$ phase constitution.

In some embodiments, the seed layer 702 and the cap layer 704 may comprise components that are not present in the intermediate alloy layer 706. For example, in one embodiment, the seed layer 702 and/or the cap layer 704 comprise silver, while the alloy layer 706 comprises a FePt alloy.

Figure 9A:
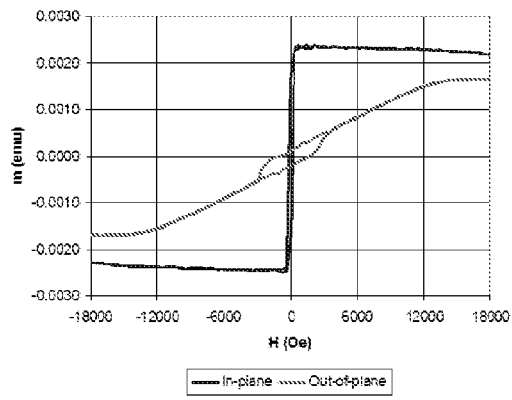
FIGS. 9A-9C are plots of magnetic moment versus magnetic field for iron-platinum alloys formed with seed and cap layers comprising one of silver or platinum.
Figure 9B:
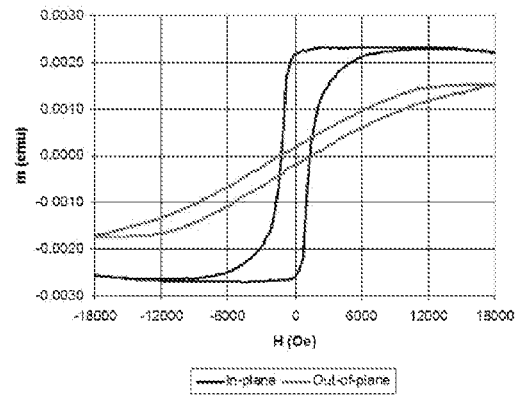
Figure 9C:
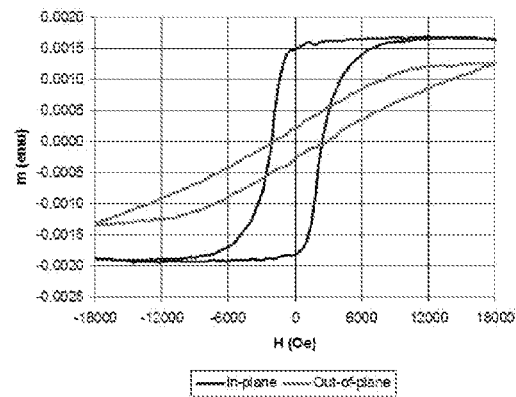

FIGS. 9A-C show magnetic moment versus magnetic field plots for three FePt alloys formed with different seed layer 702 and cap layer 704 compositions. As FIG. 9A shows, annealing a FePt alloy including, prior to annealing, about 38 at. % Pt and about 62 at. % Fe with a silver seed layer 702 and silver cap layer 704 for about 4 hours at about 300° C. produces a FePt alloy with a relatively low in-plane coercivity, approximately 200 Oe. FIG. 9B shows the response of a FePt alloy of the same composition as FIG. 9A formed with a silver seed layer 702 and a platinum cap layer 704 after annealing at the same conditions. The in-plane coercivity is much higher, about 1300 Oe. FIG. 9C, then, shows the response of a FePt alloy of the same composition as FIG. 9A formed with a platinum seed layer 702 and a silver cap layer 704 after annealing at the same conditions. The in-plane coercivity of this sample is about 2300 Oe. These coercivities are much lower than the coercivity of sample shown in FIG. 8D, which was formed with a Pt seed layer 702 and a Pt cap layer 704.

The seed layer 702 and cap layer 704 may also comprise either a component which is present in a minority amount (i.e., less than 50 at. %) in the intermediate alloy layer 706, or a component that is present in the alloy layer 706 in a majority amount (i.e., greater than 50 at. %). It may be advantageous in some embodiments to utilize a seed layer 702 and a cap layer 704 that comprise a component which is present in the alloy layer 706 in a minority amount. For example, to produce a $L1_0$ FePt alloy including a majority of Fe, a Pt seed layer 702 and a Pt cap layer 704 may be used. As another example, to produce a $L1_0$ FePt alloy including a majority of Pt, a Fe seed layer 702 and a Fe cap layer 704 may be used.

The use of a seed layer 702 and cap layer 704 comprising a component that is present in the intermediate alloy layer 706 in a minority amount results in the component in the seed and cap layers 702, 704 to diffuse into the alloy layer 706, while the other component(s) (those present in the alloy layer 706 in a majority amount) diffuse from the alloy layer 706 to the seed layer 702 and the cap layer 704. This two-component diffusion results in an alloy with a composition that is closer to a 50:50 ratio that the starting alloy. The dual component diffusion also facilitates the reordering of atoms that is necessary to produce the phase transformation to an $L1_0$ phase.

Figure 10A:
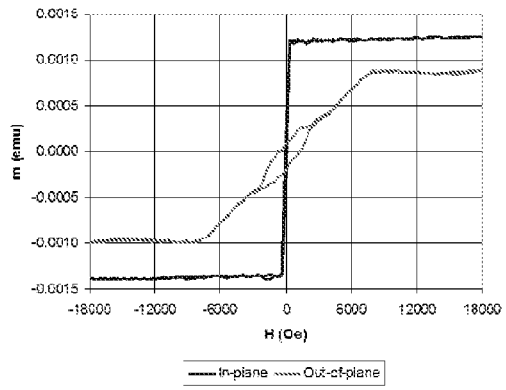
FIGS. 10A-D are plots of magnetic moment versus magnetic field for iron-platinum alloys formed with seed and cap layers comprising one of iron or platinum.
Figure 10B:
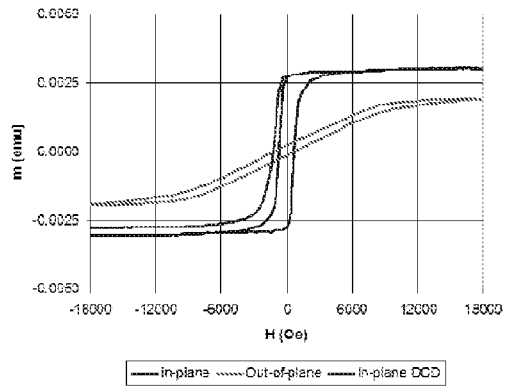
Figure 10C:
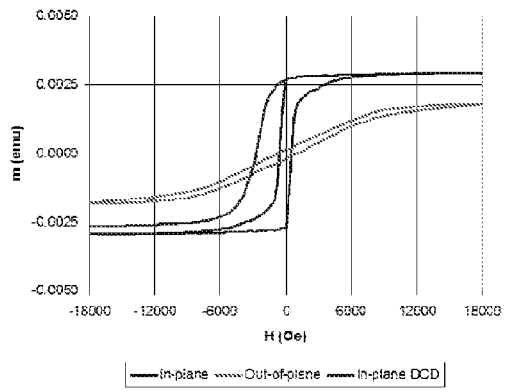

FIGS. 10A-D illustrate a series of samples including, prior to annealing, about 36 at. % Fe and about 64 at. % Pt after annealing the samples at a temperature of about 300° C. for about 4 hours. FIG. 10A shows a plot of the magnetic moment versus magnetic field for a sample formed with a Pt seed layer 702 and Pt cap layer 704. The sample shows low in-plane coercivity, indicating poor ordering of the atoms and low anisotropy. FIG. 10B illustrates the response of a similar alloy formed with a Pt seed layer 702 and a Fe cap layer 704. The in-plane coercivity is larger, about 700 Oe, which indicates better ordering of the Fe and Pt atoms into an $L1_0$ phase constitution than for the sample formed with a Pt seed layer 702 and cap layer 704. FIG. 10C is a plot of the response of another similar alloy formed with a Fe seed layer 702 and a Pt cap layer 704. The in-plane coercivity is about 600 Oe, similar to that of the sample shown in FIG. 10B.

Figure 10D:
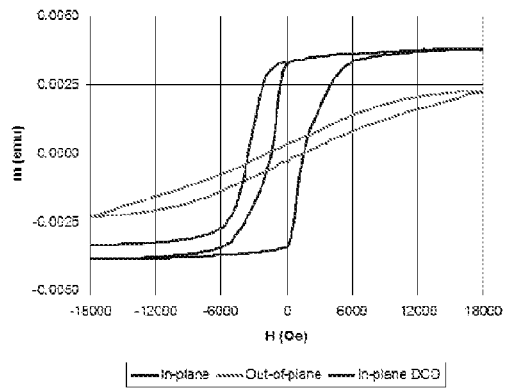

FIG. 10D illustrates the response of an alloy formed with a Fe seed layer 702 and a Fe cap layer 704. The in-plane coercivity is substantially higher, about 1500 Oe, indicating yet better ordering of the Fe and Pt atoms of the alloy layer 706 into a $L1_0$ phase constitution and higher anisotropy.

The results shown in FIGS. 9A-C and 10A-D show that the composition of the seed layer 702 and cap layer 704 plays an important role in the formation of an ordered phase constitution in the alloy layer 706, which is indicated by the coercivity of the alloy. For example, FIGS. 9A-C imply that the annealing process more effectively produces an ordered phase constitution having high anisotropy in the alloy layer 706 when the seed layer 702 and cap layer 704 comprise a component of the alloy layer 706. FIGS. 10A-D, then, indicate that the annealing process is even more effective at producing an ordered phase constitution having high anisotropy when the seed layer 702 and cap layer 704 include the component which is present in the alloy layer 706 in a minority amount.

The use of a seed layer 702 and a cap layer 704 is intended to facilitate the formation of an ordered phase constitution having high anisotropy. While not wishing to be bound by any theory, the seed layer 702 and cap layer 704 may enhance interdiffusion of the alloy components and the component(s) of the seed layer 702 and cap layer 704 at the interface of the seed layer 702 and intermediate alloy layer 706 and at the interface of cap layer 704 and alloy layer 706. This improved interdiffusion of the components at the interfaces may improve the ordering of the entire alloy layer 706, and also may drive the composition of the alloy layer 706 towards a more stoichiometric ratio of components. This results in an alloy that includes an ordered phase constitution having high anisotropy, such as an $L1_0$ phase constitution, a $L1_2$ phase constitution, or the like.

Because of the enhanced interdiffusion provided by the use of the seed layer 702 and cap layer 704, high coercivity alloys may be formed at a much lower annealing temperature. For example, a FePt $L1_0$ alloy may be produced by annealing a multilayer structure 700 at a temperature in the range from about 250° C. to about 400° C. for up to about 6 hours. Preferably, multilayer structure 700 may be annealed at a temperature of about 250° C. to about 350° C., more preferably about 300° C. In some embodiments, the annealing may preferably be for about 4 hours.

Annealing at a lower temperature may limit grain growth in the alloy compared to annealing at a higher temperature. This may be particularly desirable, for example, for a magnetic material that is to be used in a magnetic storage medium, where the data density is related to the grain size of the magnetic material.

Figure 11A:
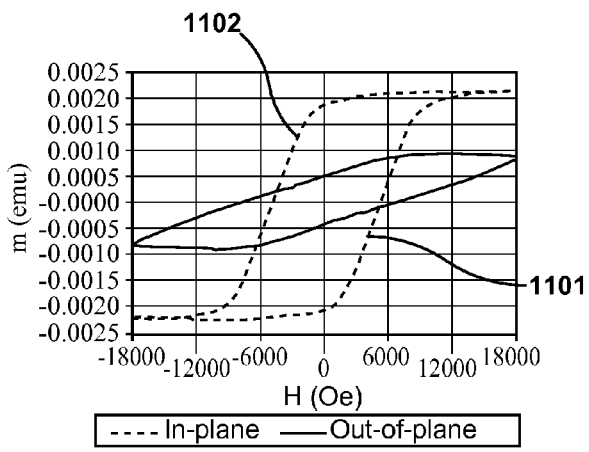
FIGS. 11A-C are plots of magnetic moment versus magnetic field for iron-platinum alloys of various compositions formed with platinum seed and cap layers.
Figure 11B:
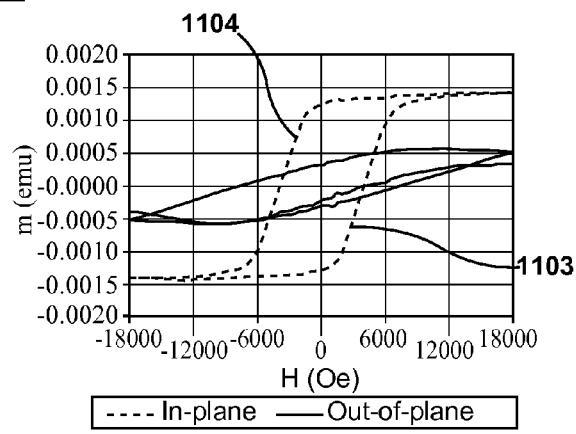
Figure 11C:
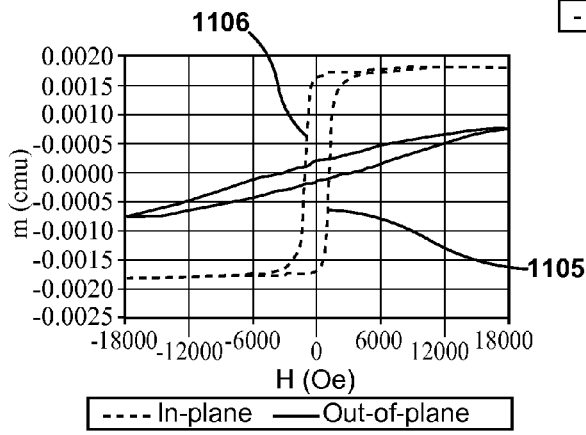

The amount of ordering and anisotropy, and thus the coercivity of an alloy, produced by the low-temperature annealing also depends on the relative amounts of Fe and Pt in the alloy layer 706. FIGS. 11A-C show plots of magnetic moment versus magnetic field for three alloy compositions after annealing with a Pt seed layer 702 and cap layer 704 for about 4 hours at about 300° C. For example, FIG. 11A shows the response of an alloy including, prior to annealing, about 62 at. % Fe and about 38 at. % Pt. The in-plane coercivity, calculated by averaging the absolute values of the coercivities of curves 1101 and 1102, was found to be about 5100 Oe, as in FIG. 8D. FIG. 11B shows the response of an alloy including, prior to annealing, about 70 at. % Fe and about 30 at. % Pt. The in-plane coercivity, calculated by averaging the absolute values of the coercivities of curves 1103 and 1104, was found to be about 4000 Oe. Finally, FIG. 11C shows the response of an alloy including, prior to annealing, about 77 at. % Fe and about 23 at. % Pt. The in-plane coercivity, calculated by averaging the absolute values of the coercivities of curves 1105 and 1106, was found to be about 1200 Oe. These results indicate that the coercivity of a FePt alloy decreases as the Fe content increases. While not wishing to be bound by any theory, it is believed that the decreased coercivity is due to decreased ordering of the FePt alloy into an $L1_0$ phase constitution.

Figure 12A:
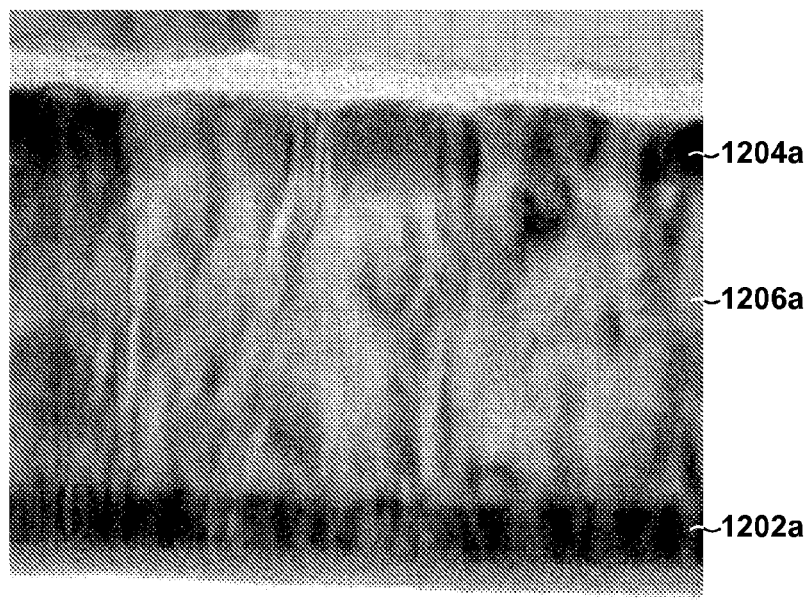
FIGS. 12A and 12B are transmission electron microscopy (TEM) micrographs of an iron-platinum magnetic material with a platinum seed layer and a platinum cap layer before and after annealing, respectively.
Figure 12B:
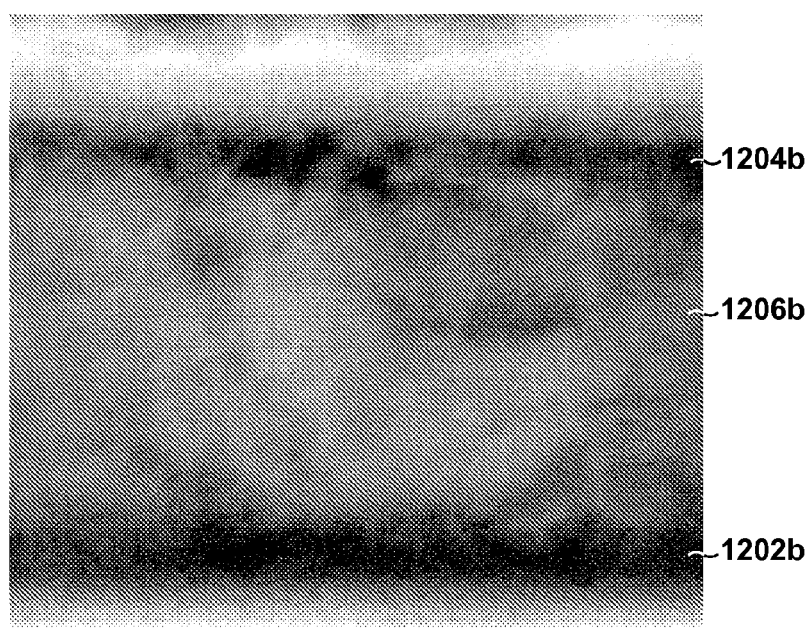

FIGS. 12A and 12B show transmission electron microscopy (TEM) micrographs of a Pt—FePt—Pt multilayer structure before and after annealing, respectively. The darker bands at the bottom and top of the FIG. 12A are a Pt seed layer 1202a and cap layer 1204a, respectively, while the lighter intermediate layer 1206a is the FePt alloy. After annealing at about 300° C. for about 4 hours, the transition from the Pt layers 1202b, 1204b to the intermediate layer 1206b becomes less distinct, and the layer 1206b itself is a more uniform shade, implying the formation of a more uniform phase structure.

Figure 13A:
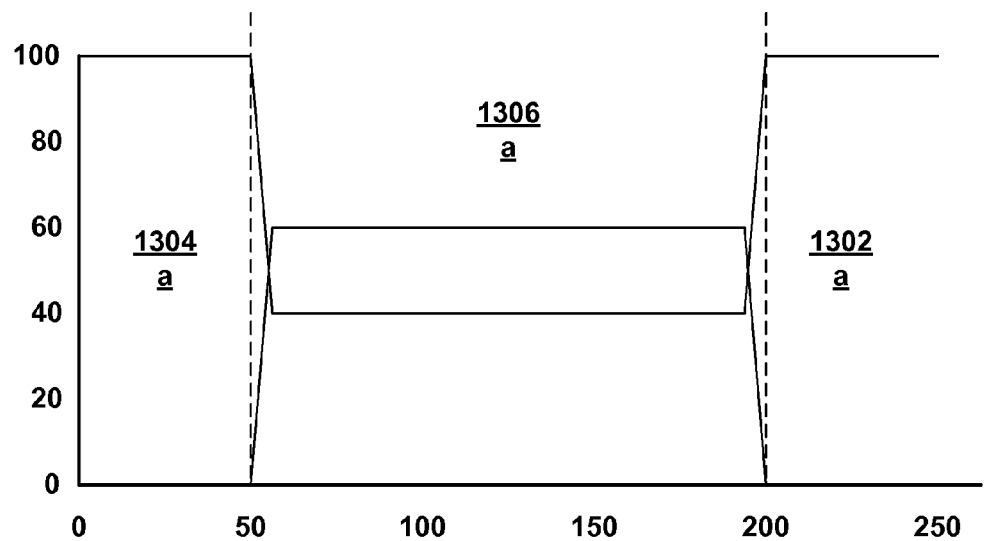
FIGS. 13A and 13B are plots of concentration versus depth for an iron-platinum magnetic material with a platinum seed layer and a platinum cap layer before and after annealing, respectively.
Figure 13B:
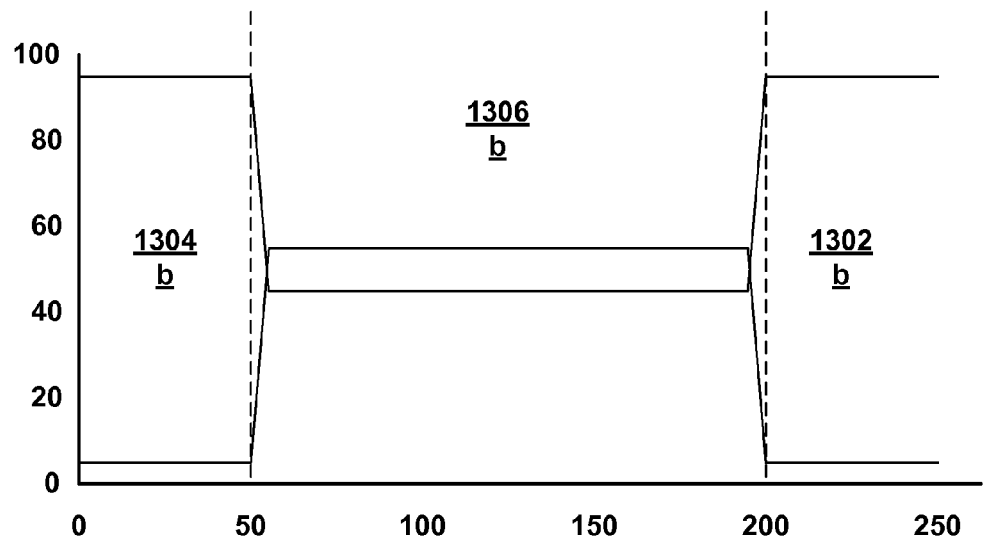

FIGS. 13A and 13B show example plots of composition versus depth for a sample similar to that shown in FIGS. 12A and 12B. FIG. 13A shows pure Pt layers 1302a, 1304a at the surface and at a depth of about 200-250 Å. The intermediate region 1306a, from about 50 Å to about 200 Å includes an alloy comprising about 60 at. % Fe and about 40 at. % Pt. After annealing at a temperature of about 300° C. for about 4 hours, the sample was remeasured and plot shown in FIG. 13B was produced. As can be seen, Pt diffused from both of the pure Pt layers into the FePt alloy. Accordingly, the Pt content of the layers 1302b and 1304b has dropped to about 95 at. %, and the Pt content of the FePt alloy intermediate region 1306b has raised to about 45 at. %. Further, while not shown, the phase constitution has changed from FCC to $L1_0$.

Figure 14:
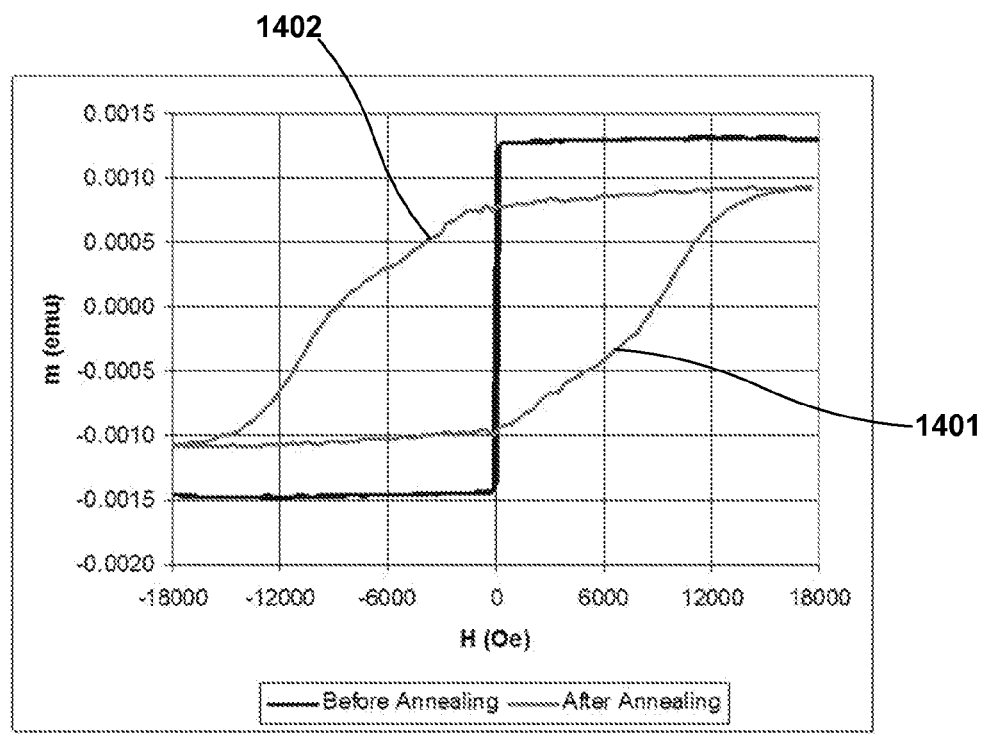
FIG. 14 is a plot of magnetic moment versus magnetic field for an iron-platinum magnetic material formed with a platinum seed layer and a platinum cap layer.

FIG. 14 shows a plot of the magnetic response of a FePt binary alloy including about 64 at. % Fe and about 36 at. % Pt. The sample has been annealed at a temperature of about 300° C. for about 4 hours prior to the measurement of the magnetic response, and has been formed with a Pt seed layer and a Pt cap layer. The alloy shows an in-plane coercivity of about 9130 Oe.

FePt alloys with a $L1_0$ phase constitution formed by the above method may make desirable biasing magnets for hard disc read heads. The $L1_0$ FePt alloys have a suitably high coercivity and magnetic moment to bias the free layer in the desired magnetic orientation. Further, the relative amounts of Fe and Pt in the alloy may be designed to provide the desired properties to the biasing magnet. For example, forming an alloy with a higher Fe content leads to a higher saturation magnetization, but a lower coercivity. Conversely, forming an alloy with a higher Pt content leads to a lower saturation magnetization, but a higher coercivity.

The biasing magnets may comprise prior to annealing from about 80 at. % Fe and about 20 at. % Pt to about 30 at. % Fe and about 70 at. % Pt, preferably from about 65 at. % Fe and about 35 at. % Pt to about 40 at. % Fe and about 60 at. % Pt.

The FePt biasing magnets may comprise a thickness that is at least partially dependent on the geometry of the hard disc read head. For example, the shield-to-shield distance of current hard disc read heads may range from about 150 Å to about 700 Å. Accordingly, the thickness of the multilayer structure 700 may be up to about 700 Å thick. In some preferred embodiments, the seed and cap layers 702, 704 each include a thickness of up to about 200 Å, more ranging from about 25 Å to about 125 Å. The intermediate alloy layer 706 may include a thickness of up to about 400 Å, preferably about 100 Å to about 300 Å.

The biasing magnets may be deposited into the read head (e.g., read head 200) as one step in the manufacture of the read head, and the entire read head subsequently exposed to the low temperature annealing necessary to form the $L1_0$ phase constitution. The temperature of the annealing is sufficiently low to not affect the performance of the remaining portions of the read head (e.g., sensor 218).

The $L1_0$ phase constitution FePt alloys of the current disclosure may also include multiple layers of different compositions. For example, the alloy may include a Pt-rich layer and a Fe-rich layer. Including multiple layers of different compositions may allow further tailoring of the magnetic field produced by the biasing magnet, and thus the bias imparted to the free layer, and other layers, of the sensor.

Figure 15:
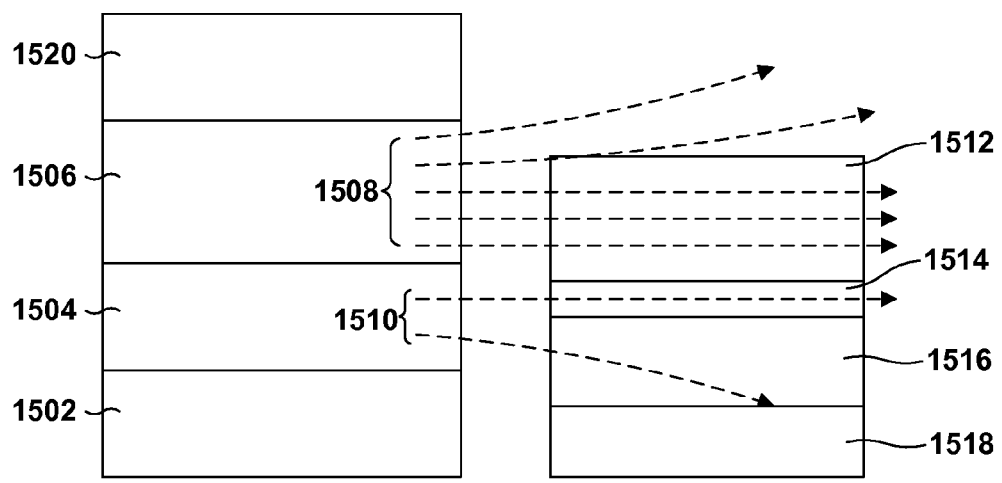
FIG. 15 is a block diagram of a multilayer iron-platinum alloy including two layers with different compositions.

For example, in many embodiments, it may be desirable to have a relatively high bias on the free layer, with a minimal bias on the reference and pinned layers. In order to accomplish this, the biasing magnet may include a Fe-rich layer 1506 approximately adjacent the free layer 1512, and a less Fe-rich layer 1504 approximately adjacent the tunneling barrier layer 1514, the reference layer 1516, and/or pinned layer 1518, as shown in FIG. 15. The Fe-rich layer 1506 produces a sufficiently large magnetic field, represented by flux lines 1508, to bias the free layer 1512, while the less Fe-rich layer 1504 possesses high coercivity, but produces a relatively weaker magnetic field, represented by flux lines 1510, and thus does not affect the reference 1516 and pinned layers 1518 as strongly. The biasing magnet 1500 further includes a Pt seed layer 1502 and a Pt cap layer 1520, which, as described above, enables the formation of an $L1_0$ phase constitution in the Pt-rich layer 1504 and the Fe-rich layer 1506.

Further, the method of producing ordered phase constitution alloys may be extended to alloys of other materials. For example, the method of using a seed layer and a cap layer may be used to produce $L1_0$ phase CoPt alloys for use in applications that require a high anisotropy magnetic material. Additionally, the method may be used to produce $L1_2$ phase constitution $IrMn_3$ or $PtMn_3$ materials for use as an antiferromagnetic material.

Various embodiments of the invention have been described. The implementations described above and other implementations are within the scope of the following claims.

The invention claimed is:

1. A method comprising:
   forming a multilayer structure comprising:
   a seed layer comprising a first component;
   an intermediate alloy layer comprising the first component and a second component, wherein the second component is different from the first component, and wherein an atomic percent of the first component is different from an atomic percent of the second component by a first amount; and
   a cap layer comprising the first component; and
   heating the formed multilayer structure to an annealing temperature between about 250° C. and about 350° C. to cause a phase transformation of the intermediate layer and cause diffusion of the first component from the seed layer and the cap layer into the intermediate layer to alter the difference between the atomic percent of the first component and the atomic percent of the second component from the first amount to a second amount.

2. The method of claim 1 and wherein the second amount is less than the first amount.

3. The method of claim 1 and wherein the first component comprises at least one of a Pt-group metal, Fe, Mn, Ir and Co, and wherein the second component comprises at least one of a Pt-group metal, Fe, Mn, Ir and Co.

4. The method of claim 3 and wherein the first component is Pt and the second component is Fe.

5. The method of claim 3 and wherein the first component is Fe and the second component is Pt.

6. The method of claim 1 and wherein at least one of the seed layer and the cap layer comprise the first component in a majority amount and the second component in a minority amount.

7. The method of claim 1 wherein the intermediate alloy layer comprises a minority amount of the first component and a majority amount of the second component.

8. A method comprising:
   forming a seed layer comprising a majority amount of a first component and a minority amount of a second component, wherein the second component is different from the first component;
   forming, on the seed layer, an intermediate alloy layer comprising a minority amount of the first component and a majority amount of the second component;
   forming, on the intermediate layer, a cap layer comprising a majority amount of the first component and a minority amount of the second component; and
   heating the seed layer, intermediate layer, and cap layer to an annealing temperature between about 250° C. and about 350° C. to cause a phase transformation of the intermediate layer from an Al phase to an $Ll_0$ phase.

9. The method of claim 8 and wherein the first component comprises at least one of a Pt-group metal, Fe, Mn, Ir and Co, and wherein the second component comprises at least one of a Pt-group metal, Fe, Mn, Ir and Co.

10. The method of claim 9 and wherein the first component is Pt and the second component is Fe.

11. The method of claim 9 and wherein the first component is Fe and the second component is Pt.

12. The method of claim 8 and wherein after heating the seed layer, intermediate layer, and cap layer to the annealing temperature to cause the phase transformation of the intermediate layer from the Al phase to the $Ll_0$ phase, the intermediate alloy layer comprises a greater percentage of the first component and a lesser percentage of the second component than prior to heating the seed layer, intermediate layer, and cap layer to the annealing temperature.

* * * * *